United States Patent
Yamaguchi

[19]

[11] Patent Number: 5,952,691
[45] Date of Patent: Sep. 14, 1999

[54] NON-VOLATILE ELECTRICALLY ALTERABLE SEMICONDUCTOR MEMORY DEVICE

[75] Inventor: Kiyoshi Yamaguchi, Kasai, Japan

[73] Assignee: Ricoh Company, LTD., Tokyo, Japan

[21] Appl. No.: 09/076,997

[22] Filed: May 13, 1998

[30]  Foreign Application Priority Data

May 14, 1997 [JP] Japan .................................. 9-141069

[51] Int. Cl.[6] .................................................. H01L 29/788
[52] U.S. Cl. .......................................... 257/316; 257/315
[58] Field of Search ..................................... 257/315, 316

[56]  References Cited

U.S. PATENT DOCUMENTS

| | | |
|---|---|---|
| 5,280,446 | 1/1994 | Ma et al. . |
| 5,557,154 | 9/1996 | Erhart . |
| 5,579,259 | 11/1996 | Samachisa et al. . |
| 5,614,747 | 3/1997 | Ahn et al. . |
| 5,633,518 | 5/1997 | Broze . |

*Primary Examiner*—Stephen D. Meier
*Attorney, Agent, or Firm*—Cooper & Dunham LLP

[57]  ABSTRACT

A non-volatile electrically alterable semiconductor memory devices and method for fabricating the device are disclosed. Memory cells of a split gate structure, each having a floating gate, a control gate and a select gate, are arranged in a matrix. The memory matrix is formed by interconnecting the memory cells within a memory block in parallel with each other to memory diffusion strips, and each of source and drain regions are shared within the memory block through the memory diffusion strips. The memory diffusion strips are each formed in a memory block dependent of other memory blocks and are respectively connected to each of metal bit lines through each of block select transistors, respectively. Control gates that are formed adjacent to the same portion of a drain diffusion strip are connected to form a control gate pair. The control gate pair is then connected to every other pair to thereby obviate possible disturbances during the read operation.

12 Claims, 16 Drawing Sheets

| | PG1 | SG | PG2 | BLK | | | | | | | | | | | | | | | | |
|---|---|---|---|---|---|---|---|---|---|---|---|---|---|---|---|---|---|---|---|---|
| Read L1 & L2 | 0 | 3 | 3 | 3 | F | F | 0 | 0 | 1.2 | 1.2 | F | F | F | F | 0 | 0 | 1.2 | 1.2 | F | F | F |
| Erase | -1 | 0 | -10 | 6.5 | 5 | 5 | 5 | 5 | 5 | 5 | 5 | 5 | 5 | 5 | 5 | 5 | 5 | 5 | 5 | 5 | 5 |
| PGM L1 | -3 | 3 | 9 | 6.5 | F | F | 5 | 5 | 0 | 0 | F | F | F | F | F | F | F | F | F | F | F |
| PGM R1 | 9 | 3 | -3 | 6.5 | F | F | F | 0 | 0 | 5 | 5 | F | F | F | F | F | F | F | F | F | F |
| PGM L1 & L2 | -3 | 3 | 9 | 6.5 | F | F | 5 | 5 | 0 | 0 | F | F | F | F | 5 | 5 | 0 | 0 | F | F | F |
| PGM R1 & R2 | 9 | 3 | -3 | 6.5 | F | F | F | 0 | 0 | 5 | 5 | F | F | F | F | 0 | 0 | 5 | 5 | F | F |

(A)

(B)

(C)

(D)

(E)

(F)

(G)

(H)

(I)

NON-VOLATILE ELECTRICALLY ALTERABLE SEMICONDUCTOR MEMORY DEVICE

BACKGROUND OF THE INVENTION

1. Field of the Invention

This invention generally relates to non-volatile electrically alterable semiconductor memory devices having split gate structures and to a method of fabricating such devices.

2. Description of the Related Art

Numerous electrically alterable non-volatile semiconductor memory devices such as EEPROMS (electrically erasable programmable read-only-memory) have been developed in recent years. Particularly, flash EEPROMs have received considerable attention, and are hereinafter referred to as flash memories.

In contrast to prior EEPROMS which have additional gating devices for each cell and are erased by one memory bit, rapid advancements in the high integration of flash memory devices has been accomplished by erasing by a predetermined unit. The unit is either a predetermined portion of the integrated device, which is hereinafter referred to as a 'block', or the entire portion of a memory device. This unit tends to be larger in size with the increase in integration.

Since flash memory devices have been regarded until recently to be used interchangeably with ultra-violet light erasable EPROMs, the unit size for the erase operation has not been of primary concern. However, as the application field of the flash memory expands it has become more desirable for the memory device to have a unit for the erasing operation which is adjustable in size.

A flash memory device is disclosed in U.S. Pat. No. 5,280,446, wherein a high device integration has been achieved by use of embedded diffusion layers for connecting a plurality of memory cells. However, since memory bit lines are formed with diffusion layers having relatively large capacitance in the memory circuit construction, this degrades the readout speed performance, which becomes more pronounced for mass storage devices.

The CR (capacitance/resistance) delay is known as one of the primary factors effecting the access time to memory cells, and capacitance C and resistance R of this structure of the embedded layer type device are determined by the configuration of diffusion bit lines (source and drain diffusion strips) and polysilicon word lines in the structure.

To reduce the CR delay, a plurality of contact holes are formed to be connected to bit lines and word lines, and metal strips are further provided in the disclosure. Although a reduction in circuit resistance is achieved by connecting these lines to the metal strips to thereby reduce the CR delay, at least two layers of metal strips are required, as disclosed therein.

FIG. 1 is a top view of a prior art memory cell having a split-gate structure.

A source diffusion strip 109 and a drain diffusion strip 108 are formed in a semiconductor substrate in the bit line direction. A control gate strip 105 is formed between the source and drain strips, and adjacent to the drain strip. That is to say, the control gate strip 105 is formed closer to the drain strip than to the source strip. A select gate strip 106 is also formed in the word line direction, which is perpendicular to the direction of the bit line and the control gate strip 105.

A portion of a memory channel 102, which is defined between the source and drain strips and adjacent to the drain region, is formed underneath the control gate strip 105 having an underlying floating gate. The remainder 101 of the memory channel is formed underneath the select gate strip 106 and between the memory channel 102, and the source strip 109 to be a channel of a select transistor. In addition, a plurality of the channel portions 101 and 102 are separated and isolated electrically from other channel portions in the bit line direction by field oxide regions 107 formed in between in a rectangular shape.

Semiconductor memory devices are fabricated, in general, with the minimum dimension feasible by the fabrication process. For memory devices such as those shown in FIG. 1, therefore, the minimum dimension for one memory cell in the word line direction 103 is generally larger than that in the bit line direction 104 because of the two channel portions compared to one portion for the latter direction.

Referring to FIG. 2, there is shown a top view of diffusion strips and their fields in a memory array structure. A plurality of source diffusion and drain diffusion strips 121 and 122, respectively, are alternatively formed, and channel regions 125 are also formed in between to thereby consist of memory cells. Also, a plurality of the field oxide regions 124 are formed for isolating memory cells in the bit line direction.

On every other strip of the source and drain diffusions 121 and 122, a plurality of contact holes 123 are formed, through which connections to overlying metal bit lines are to be made, thereby decreasing bit line resistance. By forming contact holes also on both end portions of the select gate strips and by connecting to overlying metal word lines (not shown), word line resistance also decreases.

Referring to FIG. 3, a cross sectional view of a prior art memory device is illustrated in the bit line direction (the column direction in FIG. 2), wherein an interlayer dielectrics 134 is formed between polysilicon and metal layers. The interlayer dielectric 134 isolates or insulates the floating gates 130, control gates 105 and select gates 106 from each other.

As illustrated also in FIG. 3, memory regions 131 are each formed including a plurality of memory transistors, and contact holes 132 are each formed between the memory regions for connection to the source and drain regions of the memory cells. Furthermore, there are also shown transistor gates 135 of, and contact holes 133 for, surrounding circuit components.

The memory cell region 131 consists of three layers of polysilicon, as illustrated in FIG. 3, thereby giving rise to a level difference which is larger when compared to that in the immediately surrounding regions which consist of only one polysilicon layer. Therefore, contact holes 132 formed in the vicinity of the memory regions 131 are higher than those in the immediately surrounding regions.

Because of a limitation in the focal depth feasible during the photolithography process, the above-mentioned level difference in the memory regions reduces the spatial resolution during the process, thereby causing unwanted increase in the minimum dimension for the fabrication.

The diameter of through-holes is generally larger than that of contact holes during process steps. When metal bit lines are formed over the metal word lines, a through hole 141 has to be formed on top of a contact hole in the memory region as illustrated in FIG. 4, and this results in the pitch of metal bit lines exceeded by that of through-holes. Accordingly, when a contact hole has already been fabricated with the minimum fabrication dimension in the source and drain regions, it is not feasible to form a through-hole on top of a contact hole and metal bit lines have to be formed below the metal word lines.

Referring now to FIG. 5, a cross sectional view of a prior art memory device is illustrated in the bit line direction, wherein a first metal layer (a lowermost metal layer in case of a plurality metal layers) is used as metal bit lines, while a second metal layer (a second lowermost metal layer in case of a plurality metal layers) is used as metal word lines.

Since the pitch of the memory cell in the bit line direction 104 is smaller than that in the word line direction 103, as illustrated earlier in FIG. 1, there results in the construction of FIG. 5, wherein the pitch of the second metal layer 151 is larger compared to the pitch of the memory cells 104 in the bit line direction.

The block unit for an erase operation has generally been determined by the way the memory bit lines are shared. As aforementioned, this gives rise to the limitations of prior art memory devices, among others, in that all of the memory cells sharing one single memory bit line are generally erased and the size of the erase block has not been selected at will.

In addition, for the prior art flash memory devices, difficulties have been experienced in erasure by ultra-violet light exposure, which is requisite for preparing reference cells in memory cell arrays. These reference cells are considerably important for implementing standard signal generation for readout circuits and process data analysis.

This erasure is carried out for memory cells to release electric charges remaining in the floating gate after finishing of the fabrication process steps. After the charges are released, a group of memory cells can be used as reference cells.

In the prior art memory devices, wherein the pitch of an overlying metal layer is different from the pitch of memory cells disposed below the metal lines, and wherein an ultra violet light erasure may not be achieved for the entire array of cells due to shaded memory cells which are caused by the above-mentioned difference between the pitches. These non-erased cells will result in every certain number of cells in the bit line direction.

In addition, when the first or the lowermost metal layer is used as metal bit lines, a relatively small distance results between select gates, thereby giving rise to the increase in CR delay of the circuit.

SUMMARY OF THE INVENTION

The general purpose of this invention is therefore to provide improved memory device structures and a fabrication method thereof, having most, if not all, of the advantages and features of similar employed related structures and methods, while eliminating many of the aforementioned disadvantages of other related structures and methods.

Accordingly, one object of this invention is to overcome the above-described limitations of conventional structures and method. This and other objects are addressed by the present invention.

In one embodiment of the present invention, a semiconductor memory device includes a plurality of memory cells arranged in a matrix. The memory matrix consists of a plurality of memory blocks defined independently of the regions of the memory cells which share one single metal bit line. The memory diffusion strips within the memory block are formed with source and drain regions of the memory cells, being divided from other memory blocks, such that each of the memory diffusion strips is connected to one of the metal bit lines through one of the block transistors. In addition, control gates are formed, which connect a plurality of the memory cells within the memory block and is divided from other memory blocks.

In another embodiment of the present invention, a semiconductor memory device includes a memory matrix, further provided with control gates that are formed to connect a plurality of memory cells such that each of the memory blocks may be operable independently of other memory blocks. In this embodiment, a pair of the control gates sharing one single drain region are connected together to be equipotential and to form a control gate pair, and a plurality of the control gate pairs are then interconnected within the memory block. This procedure is repeated for all control gate pairs. Subsequently, one group of the connected pairs (or the first group) is connected not to another group neighbored to the first group but to the group next neighbored, to thereby form two sets of the control gate pairs to thereafter be connected to polysilicon strips.

With this construction of the memory matrix, the unit size for the erasing operation can be selected independently of the regions of the memory cells defined by sharing the same metal bit line, to thereby be able to obviate the limitations of prior art memory devices described earlier and to be able to choose the unit size for the erasing operation with more ease.

Furthermore, since the block select transistors are formed between the regions of the contact hole and memory cells above the memory bit lines, the distance between the contact hole and memory cells increases. Although the memory cell region consists of three layers of polysilicon, the above-mentioned increase in the distance from the memory cell region results in the decrease in the level difference. This makes the formation of the contact holes feasible having an approximately same diameter as that of surrounding circuit components.

In yet another embodiment, a method for fabricating a semiconductor memory device is disclosed which includes the steps of forming a gate dielectric layer on the entire surface of the substrate of a first conductivity type; forming thereon a plurality of memory diffusion strips of a second conductivity type being parallel to each other in the substrate such that a pair of the memory diffusion strips are arranged alternatively to be source or drain regions of a plurality of memory cells, being isolated by field oxide layers formed therebetween, to thereby define a channel between the source and drain regions, wherein each of the channels has a first channel portion adjacent to the drain region and covered by a floating gate and a second channel portion adjacent to the source region; forming a control gate over the floating gate having an underlying dielectric layer to thereby form a stacked gate; implanting ions into the regions such as (1) the portion of the memory diffusion strip where a source or drain region of the memory cell is formed, and (2) the portion of the memory diffusion strip connected to the region where a block select transistor is formed, and forming a block select transistor in that region.

BRIEF DESCRIPTION OF THE DRAWINGS

The present invention together with its various features and advantages, can be more easily understood from the following more detailed description taken in conjunction with the accompanying drawings in which.

DESCRIPTION OF THE ILLUSTRATIVE EMBODIMENTS

Figure 1:
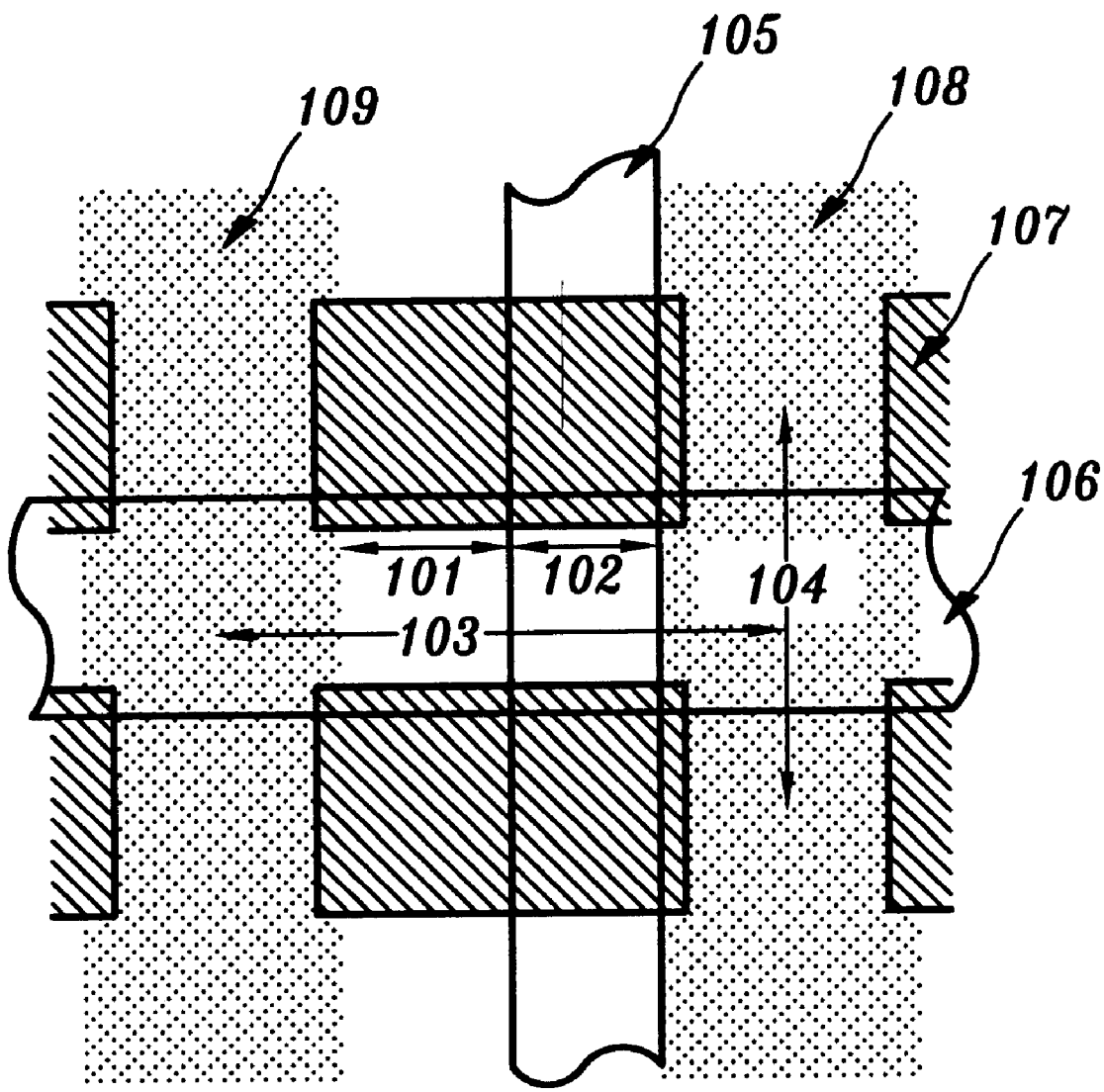
FIG. 1 is a topological view of one prior art memory device having a split gate structure.
Figure 2:
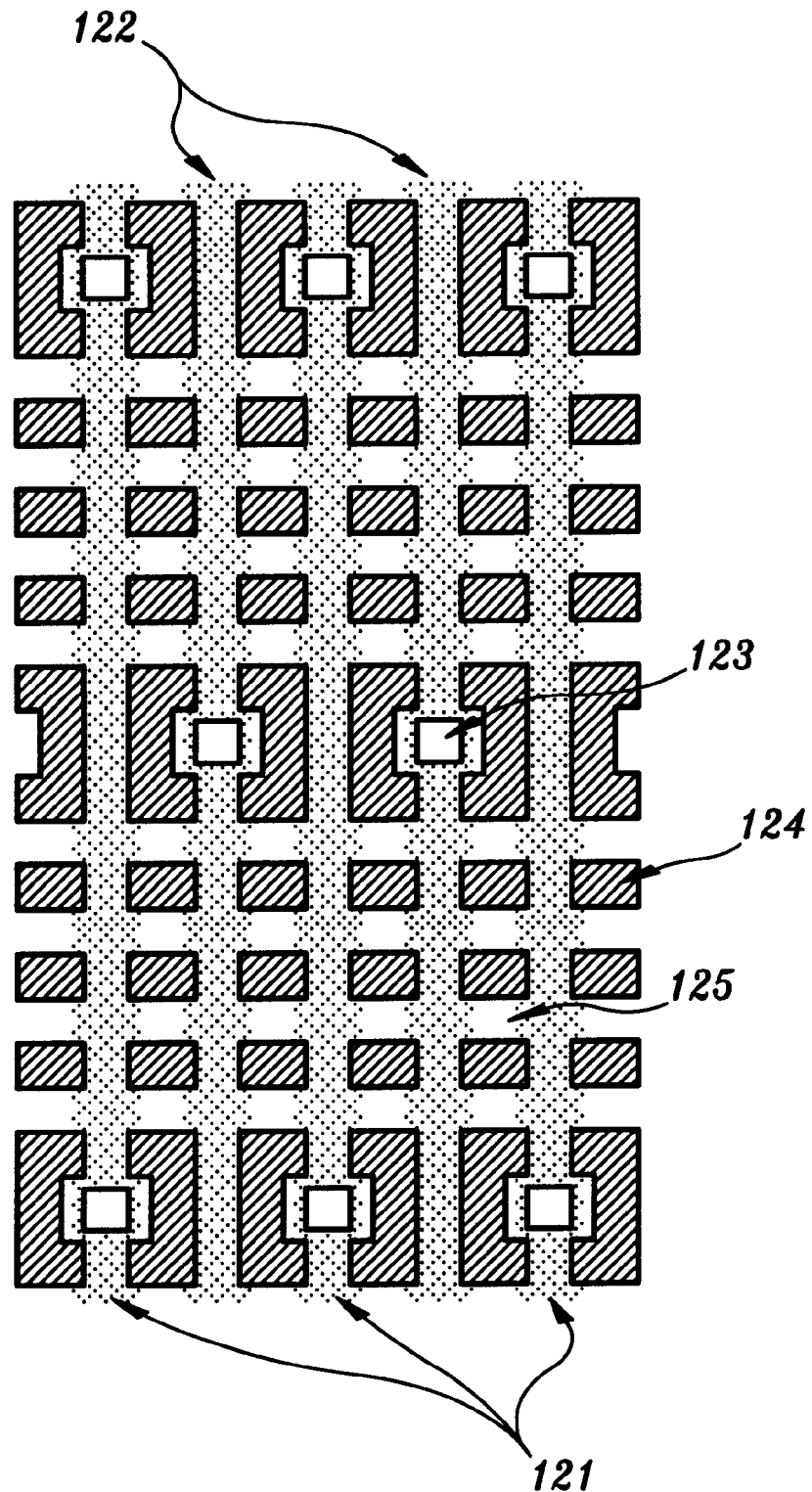
FIG. 2 is a topological view of a memory matrix field and memory diffusion strips of another prior art memory device.
Figure 3:
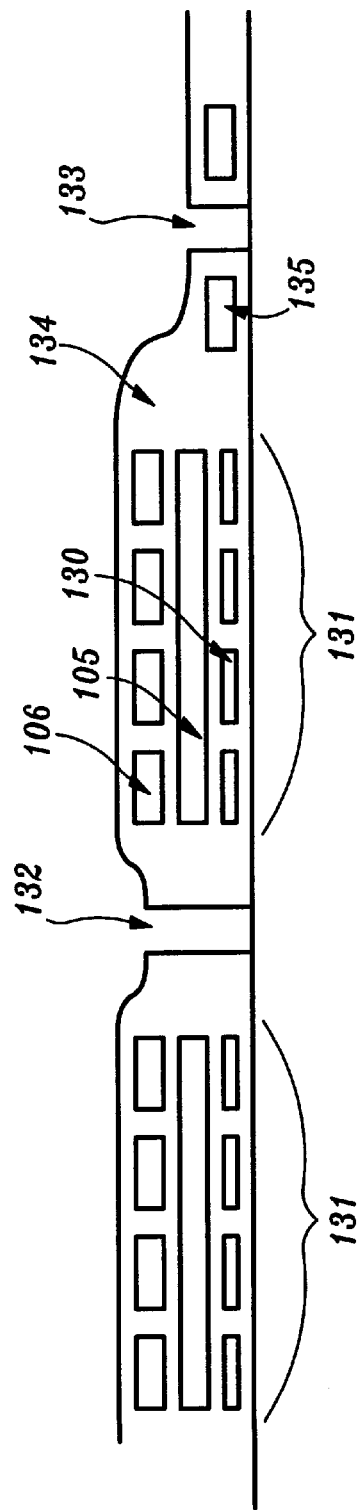
FIG. 3 is a cross sectional view of still another prior art memory device taken along the bit line direction.
Figure 4:
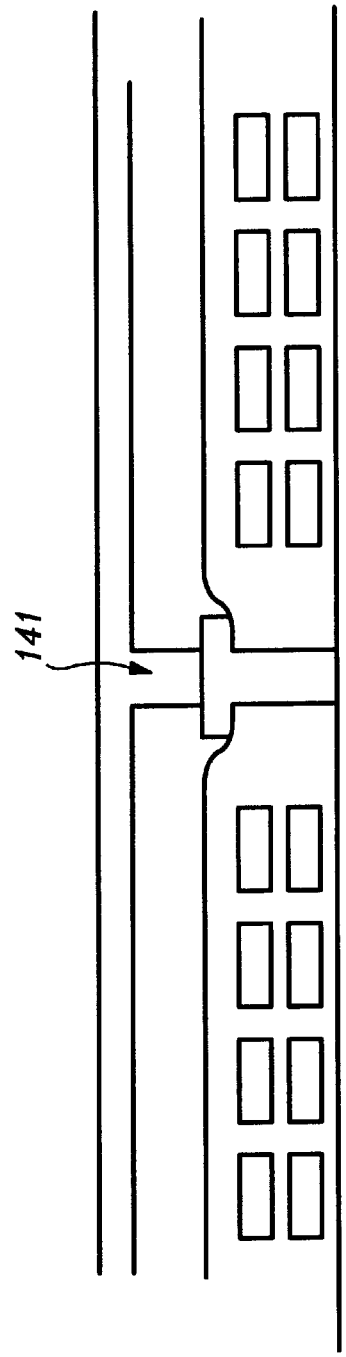
FIG. 4 is a cross sectional view of another prior art memory device, wherein a through-hole is provided at the top of a contact hole.
Figure 5:
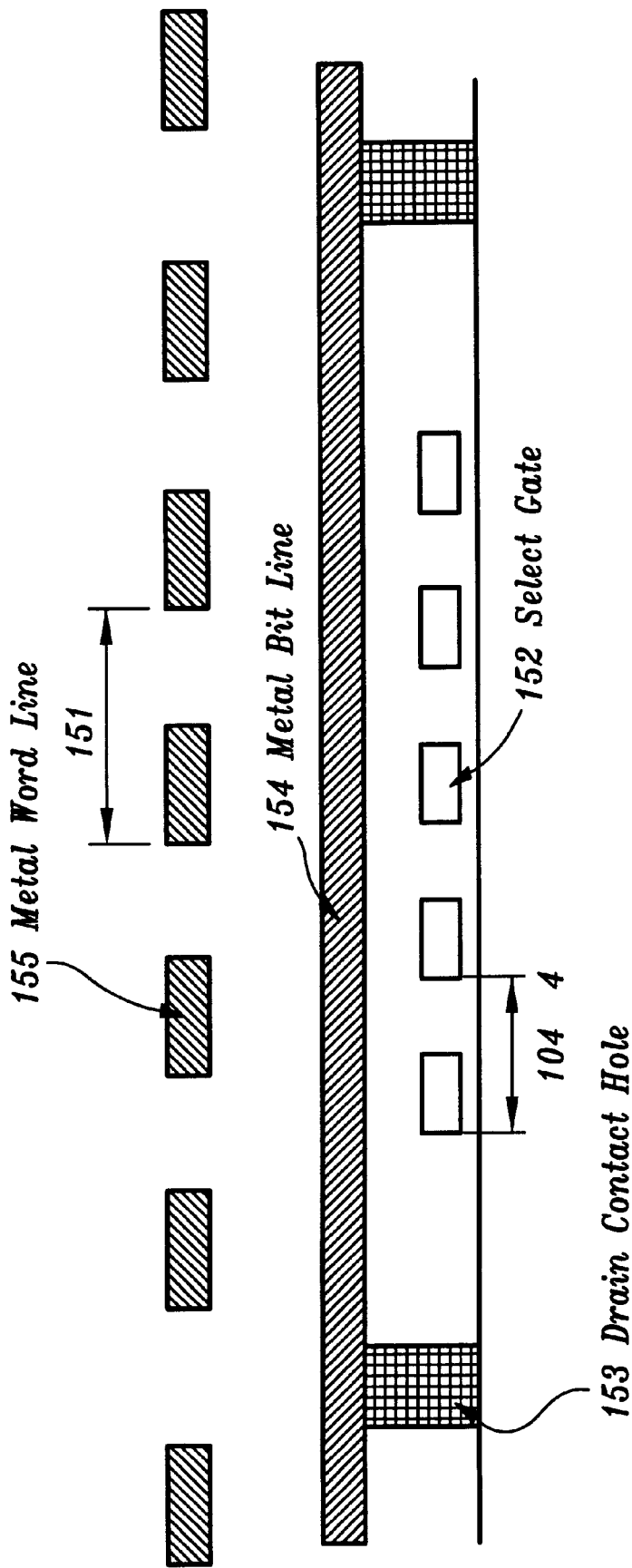
FIG. 5 is a cross sectional view of another prior art memory device taken along the bit line direction, wherein metal word lines are formed over underlying metal bit lines.

A plurality of memory cells of the present invention are arranged in a matrix and are adjacent to one of a plurality of memory diffusion strips to be symmetric in the direction of the memory diffusion strip or the memory bit direction.

In this memory matrix architecture, a plurality of memory cells are connected to consist of memory blocks, and each memory block is defined independently of the region of the memory cells which share one single metal bit line. In the memory block, the memory diffusion layers are formed with source and drain regions of the memory cells, being divided from other memory blocks, such that each memory diffusion layer is connected to one of metal bit lines through one of block transistors that is formed in the region between two neighboring memory blocks in the bit line direction.

In addition, control gates are formed to connect a plurality of the memory cells within the memory block such that each of the memory blocks is divided from other memory blocks, and such that a pair of the control gates which share the same drain region are connected to each other to be equipotential and to form a control gate pair. A plurality of control gate pairs are then connected within the memory block and this procedure is repeated for all of the control gate pairs. Subsequently, one group (the first group) of the connected pairs is connected not to another group adjacent to the first group but to the group next adjacent thereto, to thereby form two sets of control gate pairs. These two sets are each thereafter connected to polysilicon strips.

With the present interconnection of the control gates, applied potential voltage to a memory bit line does not practically affect adjacent bit lines, to thereby obviate possible disturbance during a read operation.

During the fabrication, a plurality of metal strips are formed to accomplish the connection between the memory diffusion strips.

One of the metal strips is formed to connect a plurality of the control gate pairs. When this metal strip traverses the portion of the memory diffusion strip which connects to the regions for block select transistors to be formed, a process step of implanting ions into these regions is carried out prior to the step of the gate oxide layer formation, the advantages of which will be described hereinbelow.

Source and drain regions of the block select transistors may preferably be fabricated to have the same impurity concentration as that of transistors of the peripheral circuitry.

During the fabrication steps, two groups of gate electrodes of block select transistors are each formed in line, one being connected to source regions and the other connected to drain regions of the memory cells. The two groups are each preferably formed spaced-apart, parallel to each other and to the word line direction.

The distance between block select transistors may be increased with the present construction to accomplish higher current values for the transistors and thereby higher readout speed for the memory device.

A plurality of the metal bit lines in strips are provided spaced apart, being essentially parallel to, and with a distance approximately equal to that of the memory diffusion layers, having overlying dielectric layers, and thereafter connected to the block select transistors through contact holes.

Likewise, a plurality of metal word lines in strips are provided spaced apart, being essentially parallel to the select gates, and having a pitch approximately equal to that of the select gates, having overlying dielectric layers. The metal word lines are then connected to the select gates through contact holes that are provided on extensions of the select gates. In addition, the metal word lines are provided preferably under the metal bit lines.

With this construction of the metal lines, the capacitance between the metal bit lines and word lines can be reduced to thereby accomplish higher readout speeds for the memory device. Also with this construction, overlying metal layers both in the bit line and word line directions may be fabricated so as to have the same pitch as that of memory cells. This makes it possible to eliminate the shading of the memory cells which are caused by the aforementioned difference between the pitches and to carry out an ultra violet light erasure throughout the memory cells in the device.

Figure 10:
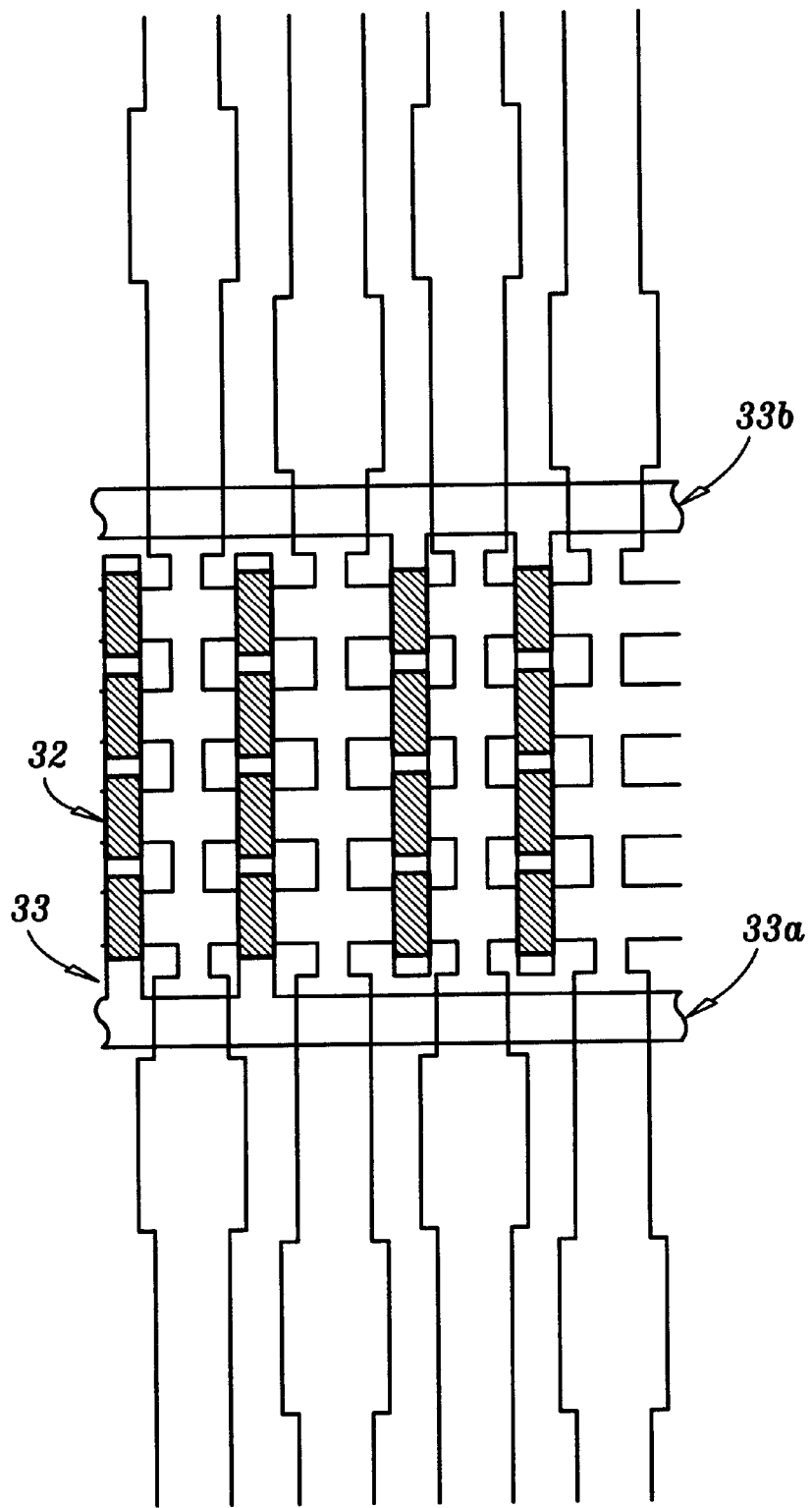
FIG. 10 is a topological view of the memory device of FIG. 6 during the process steps used in the formation of control gates and floating gates.

A plurality of the control gates are formed also being divided by the memory block. The control gates within each of memory blocks are preferably connected to polysilicon strips 33a and 33b (FIG. 10). The polysilicon strips are thereafter connected to one of the metal lines which is formed parallel to the word line over the polysilicon strip having an underlying dielectric layer. With this construction, the resistance for the connection of control gates can be reduced and higher readout speeds for the memory device therefore become feasible.

A plurality of gate electrodes of the block select transistors are formed of polysilicon strips so as to be connected each other within a memory block. The polysilicon strip is preferably connected to one of the metal lines which is formed parallel to the word line over the polysilicon strip having an underlying dielectric layer.

With this construction, the resistance for the gate electrodes of the block select transistors can be reduced and higher readout speeds for the memory device becomes feasible.

Figure 6:
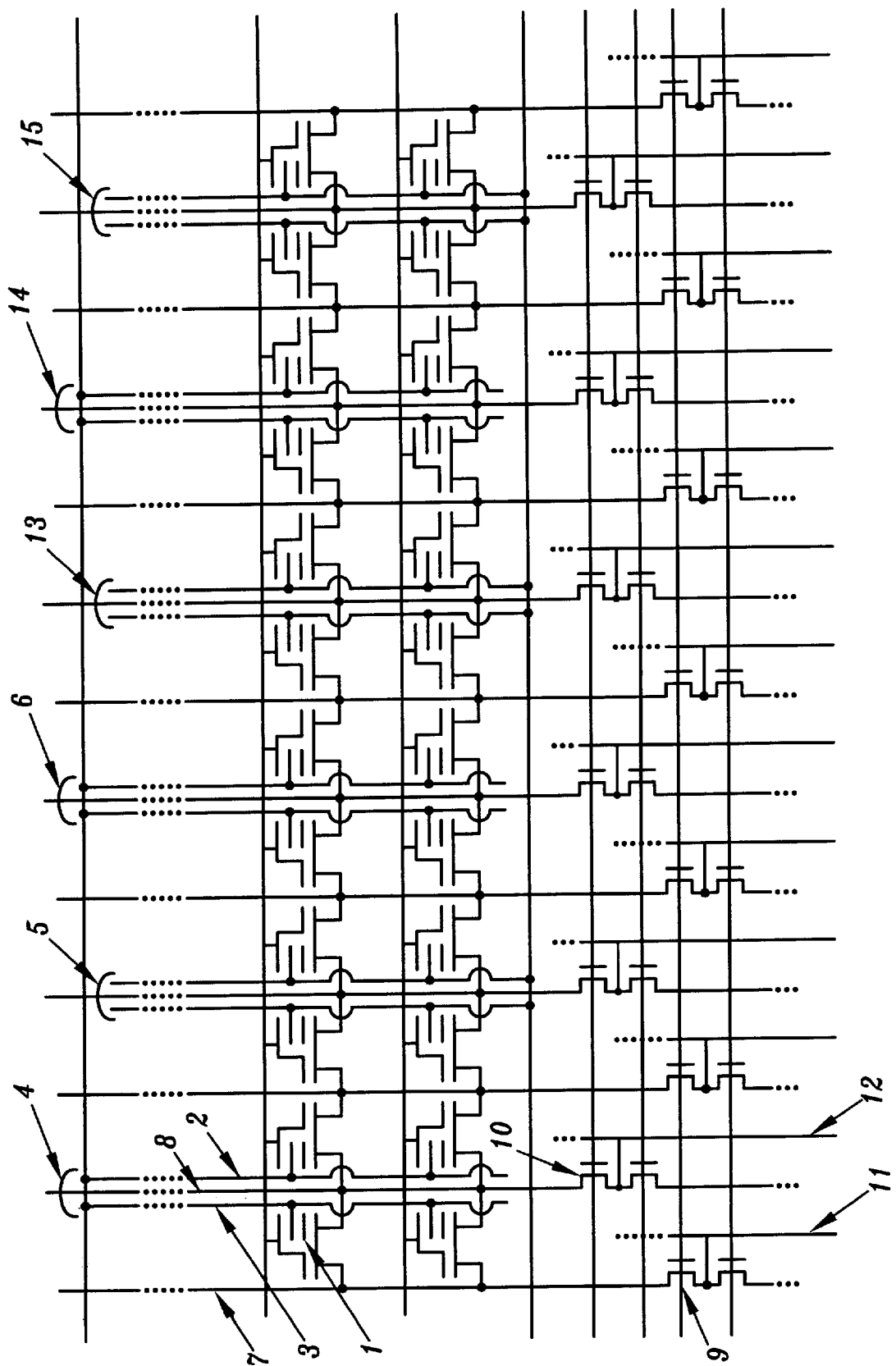
FIG. 6 is a schematic representation of memory arrays in accordance with the embodiment of this invention.

FIG. 6 illustrates a typical memory array in a memory cell matrix in accordance with one embodiment of the present invention.

In the present memory device, the memory cells 1 of the split gate structure, each having a floating gate, a control gate and a select gate, are arranged in a matrix. The memory matrix is formed by interconnecting memory cells in a memory block in parallel with each other to memory diffusion strips 7 and 8, and each of source and drain regions are shared within the memory block through the memory diffusion strips.

The memory diffusion strips 7 and 8 are each formed in a memory block independent of other memory blocks and are respectively connected to metal bit lines 11 and 12 through block select transistors 9 and 10. The memory cells are thus arranged in symmetric form in the direction of memory diffusion strips 7 and 8.

Control gates 2 and 3 that are formed adjacent to the drain diffusion strip 8 are connected to form a control gate pair 4. The control gate pair 4 is then connected to every other pair of control gates (e.g., to control gate pairs 6 and 14), and not to the control gate pair 5 adjacent to the control gate pair 4. In a similar manner, control gate pair 5 adjacent to the pair 4 is connected to every other control gate pair 13 and 15.

With the present interconnection of the control gates, applied potential voltage to a memory bit line does not practically affect immediately adjacent bit lines, to thereby obviate possible disturbance during a read operation. In addition, it is noted that all of the control gate connections are made within each memory block and that no connections are made between other memory blocks.

Figure 7:
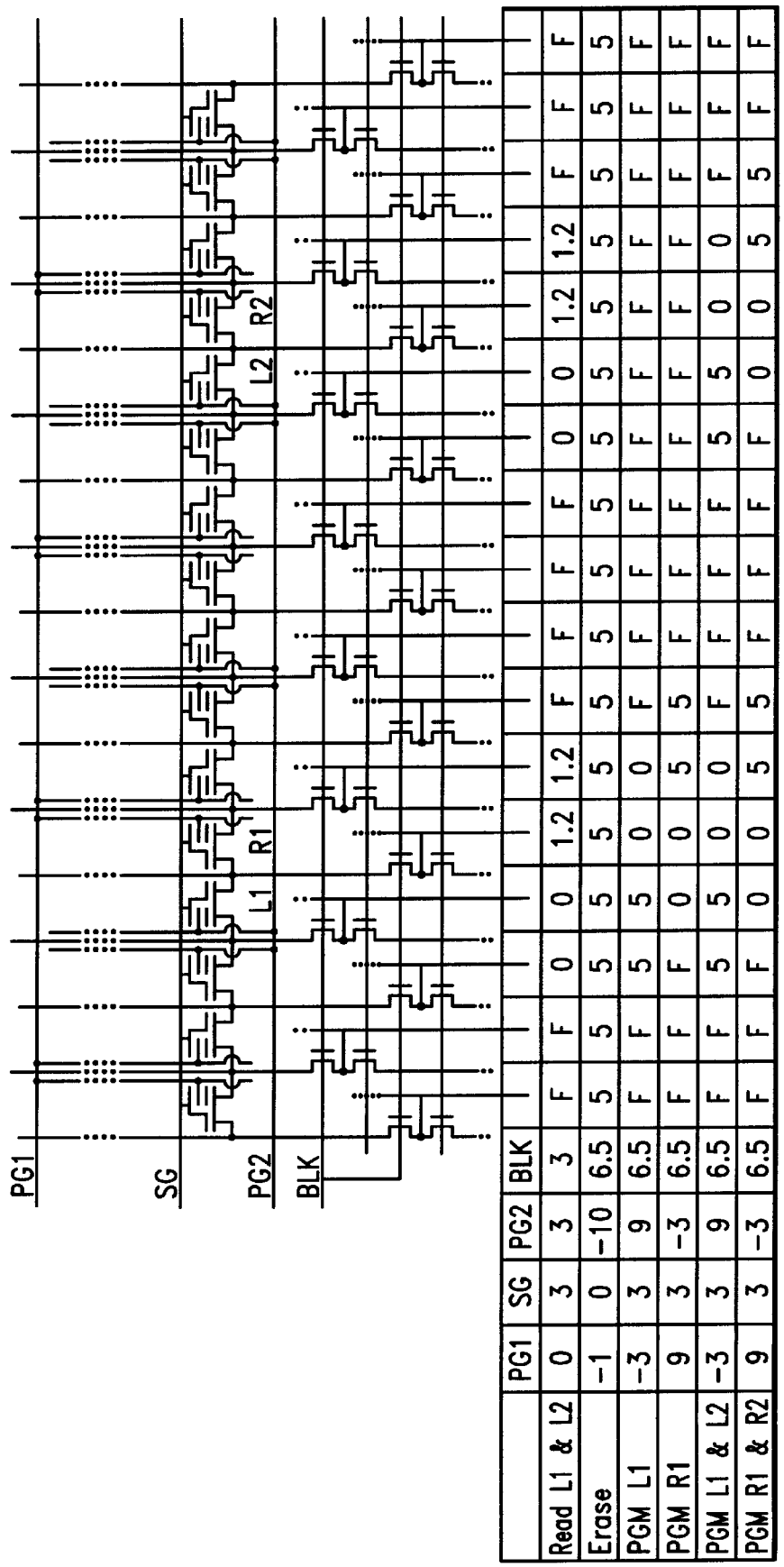
FIG. 7 contains a table which shows voltage conditions for various operational modes for the memory device of FIG. 6 in accordance with the embodiment of this invention.

FIG. 7 contains a table which illustrates voltage conditions for various operational modes for the memory device according to the embodiment of the present invention.

In the table, the potential value is shown under the row heading "Read L1 and L2", which is to be applied to each corresponding line in the FIG. 7 for carrying out the readout operation of data stored in the cells L1 and L2. Also in the table, the potential is in volts, "F" is for floating, "Erase" is for erasing all of the memory cells, and "PGM" is for programming of the write operation for each memory cell.

Figure 8:
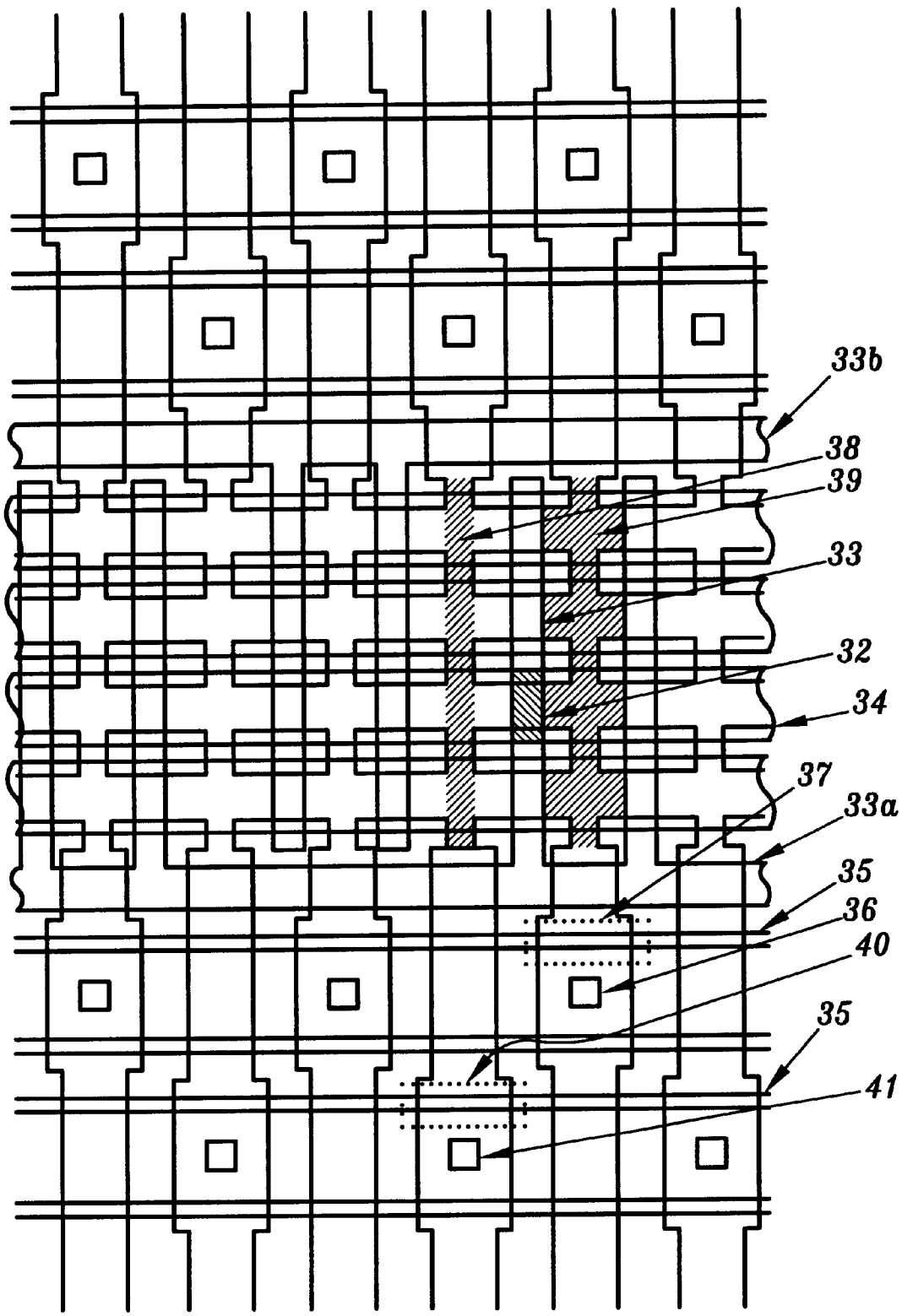
FIG. 8 is a topological view of the memory device of FIG. 6 in accordance with the embodiment of the present invention.

FIG. 8 illustrates a top view of a circuit pattern of the memory device of FIG. 6 fabricated on a semiconductor substrate in accordance with one embodiment of the present invention.

Referring to FIG. 8, a plurality of floating gates 32 are formed between the source and drain regions, having a length smaller than that of from source 38 to drain 39 and at a distance closer to drain region 39 than to the source region 38. A plurality of control gates 33 of polysilicon are also formed over the floating gates parallel to the drain memory diffusion strip 39.

The source diffusion and drain diffusion strips 38 and 39 are respectively shared by memory cells which are formed adjacent to the same diffusion strips and parallel to the diffusion strip direction.

In addition, as described earlier, the control gates 33 which are formed adjacent to the same drain are connected together through the polysilicon layers 33a and 33b to form control gate pairs, and the control gate pairs are connected to alternate control pairs, to thereby form two sets of the connected control gate pairs. These connected control gate pairs are formed within each of the memory blocks independent of the other memory blocks.

Also in a manner described earlier, a plurality of select gates 34 are also formed of polysilicon perpendicular to the control gate 33. In addition, the memory diffusion strips such as the source diffusion 38 and the drain diffusion strips 39 are formed within one of the memory blocks independent of other memory blocks.

The source diffusion 38 and the drain diffusion strip 39 are then connected to block select transistors 40 and 37, respectively, and further to metal bit lines (not shown in FIG. 8) through contact holes 41 and 36.

Referring again to FIG. 8, two groups of connected gate electrodes 35 of block select transistors 40 and 37 are each formed in line, one being connected to source regions 38 and the other connected to drain regions 39 of the memory cells. The two groups are formed not on the same line but spaced-apart to each other.

The distance between block select transistors is increased with this construction to accomplish higher current values for the transistors and thereby higher readout speeds for the memory device.

Referring now to FIGS. 9 through 17, a fabrication process of the present invention will be detailed hereinbelow.

Figure 9:
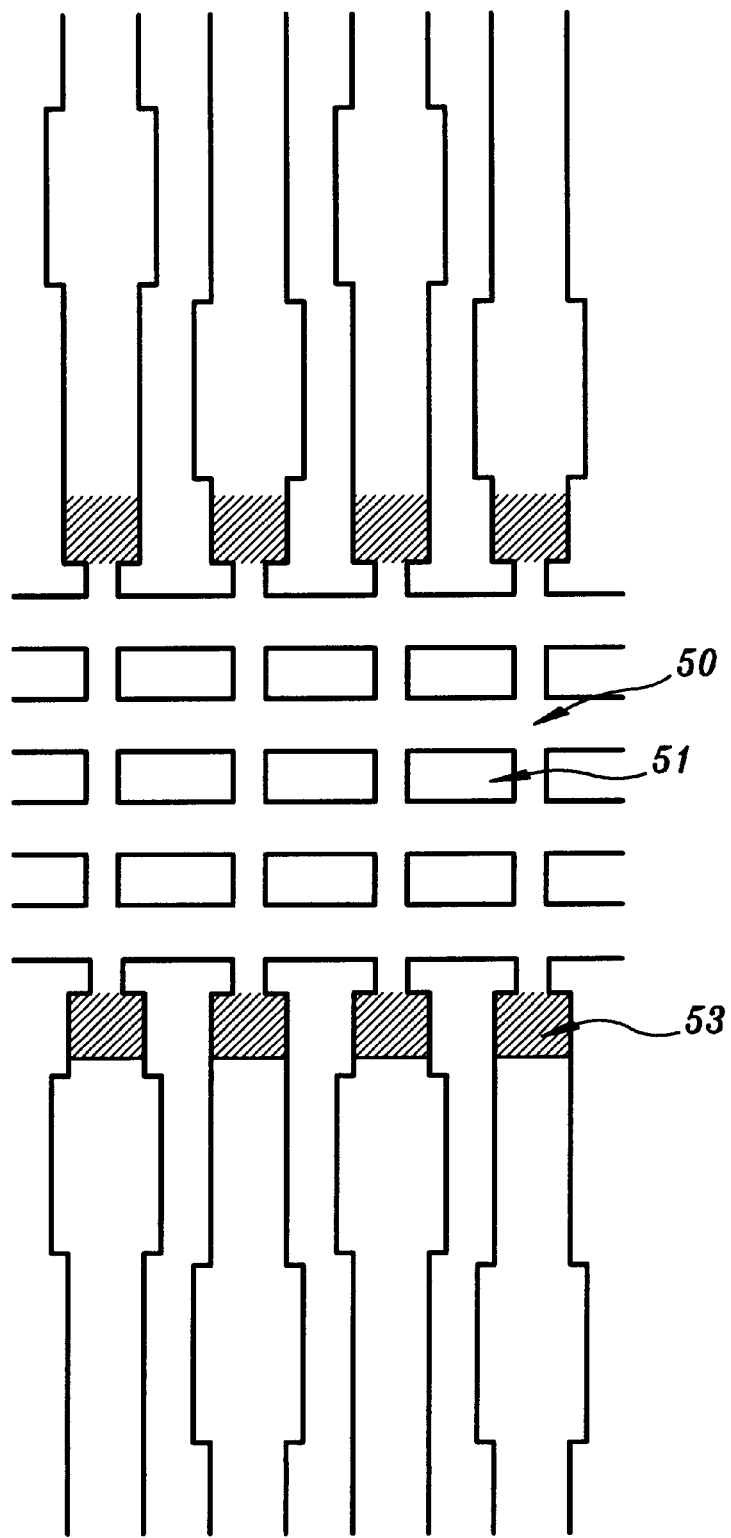
FIG. 9 is a topological view of the memory device of FIG. 6 during the process steps used in the formation of field oxide layers for isolation and in the ion implant into the regions for connecting control gates.

(A) The starting material is assumed to be P-type silicon substrate on which a field oxide layer is grown. As illustrated in FIG. 9, portions of this layer are removed for forming active regions 50, in which memory cells, block select transistors, peripheral transistors and diffusion layers are to be formed. The remainder of the field oxide is used to isolate the active regions from each other.

Subsequently, an implanting step using arsenic (As) ions is carried out into the regions 53 in the active regions 50, which traverses polysilicon strips 33a and 33b to be connected to a plurality of control gates (FIG. 8).

(B) A gate oxide layer is then grown over the entire surface of the structure, followed by the formation of a polysilicon layer thereon, from which floating gates 32 are to be formed as shown in FIG. 10. The polysilicon layer is defined by etching into regions to be isolated from each other by removing portions thereof perpendicular to the bit line direction, to thereby form the floating gates 32. Another polysilicon layer is formed thereon, from which control gates 33 are to be formed.

The thus formed layer comprising the following contiguous layer portions grown from the bottom in the order recited, the polysilicon layer portion for floating gates, an interpoly dielectrics portion and the polysilicon portion for the control gates, is hereinafter referred to as a floating gate polysilicon/interpoly dielectric/control gate polysilicon layer.

The floating gate polysilicon/interpoly dielectric/control gate polysilicon layer is then subjected to an etching process step to define the layer into strips parallel to the bit line direction to thereby form floating gates 32 and control gates 33 such that these gates are capable of being operated within each memory block independent of other memory blocks.

During the defining process, the control gate polysilicon layer is subjected to an etching process step to form control gates in long strips running parallel to the memory bit direction such that a pair of the control gates sharing the same drain region are connected together to be equipotential and to form a control gate pair, and a plurality of control gate pairs are then connected within the memory block. This procedure is repeated for all control gate pairs.

Subsequently, one group of the connected pairs (or the first group) is connected not to another group adjacent to the first group but to the next group [next neighbored], to thereby form two sets of the control gate pairs to be connected thereafter to polysilicon strips 33a and 33b.

Figure 11:
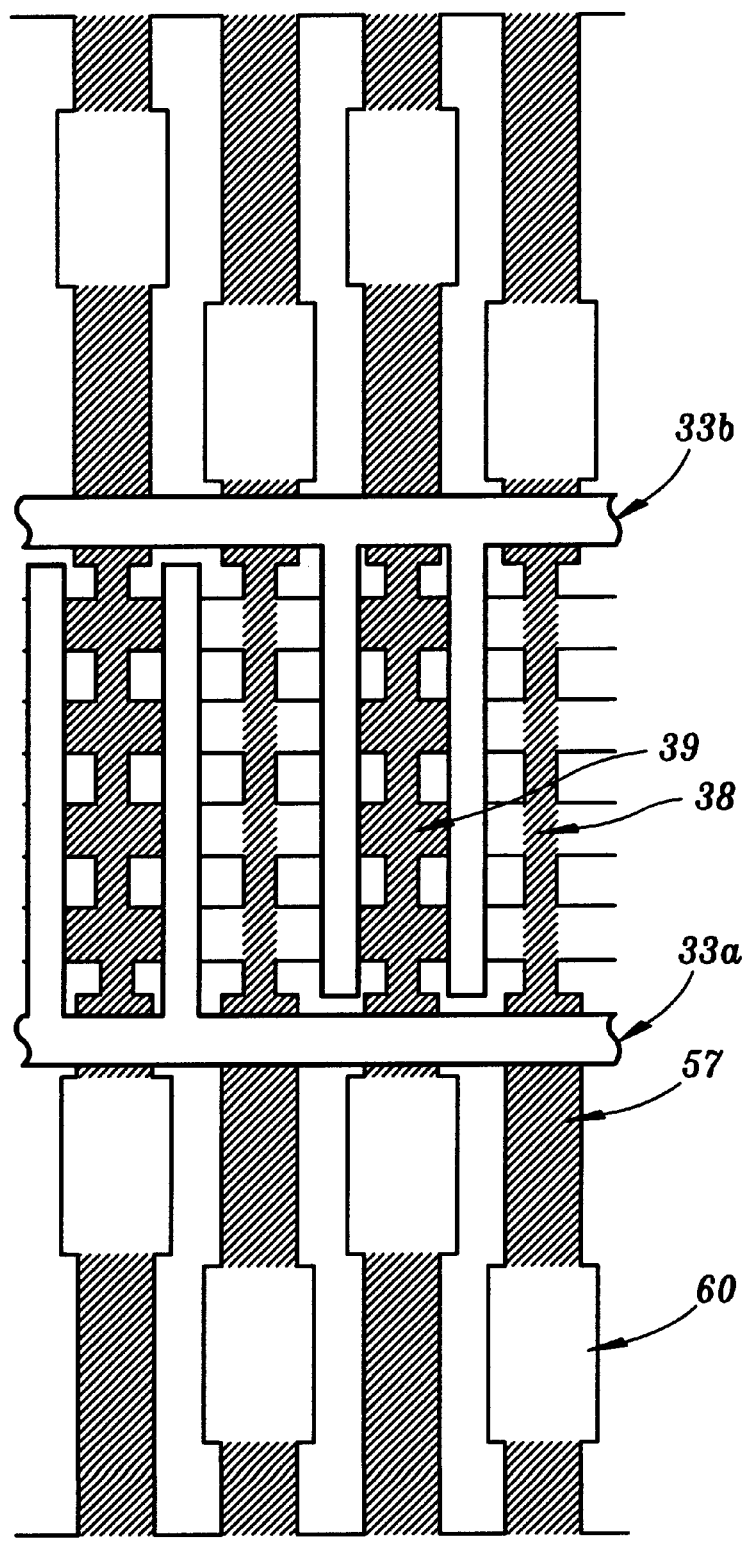
FIG. 11 is a topological view of the memory device of FIG. 6 during the process steps used in the ion implant into the portions of memory diffusion strips where a source region and a drain region of each memory cell are to be formed, and the portion of the memory diffusion strip connected to the region where a block select transistor is to be formed.

(C) Referring to FIG. 11, an implant process step is subsequently carried out with As ions into the regions such as (1) the portion of the memory diffusion strips where a source or drain region 38 and 39 of the memory cell are to be formed, and (2) the portion 57 of the memory diffusion strip connected to the region 60 where a block select transistor is to be formed.

During this process step, the portions 57 of the strips which are overlaid by the polysilicon strips 33a and 33b, are not implanted with As ions, because these control gate strips are acting as a mask against the ion implant.

It is noted, since the above portions have already been implanted with As ions prior to the formation of the control gate strips, as described earlier, the continuity between the memory diffusion strips and the block select transistors can be maintained even without the present ion implantation. In addition, a satisfactory insulation in this region is also retained between the memory diffusion strips and the block select transistors because of the oxide layer with the thickness larger than that of the gate oxide layer, which resulted from the impurity enhanced oxidation.

Figure 12:
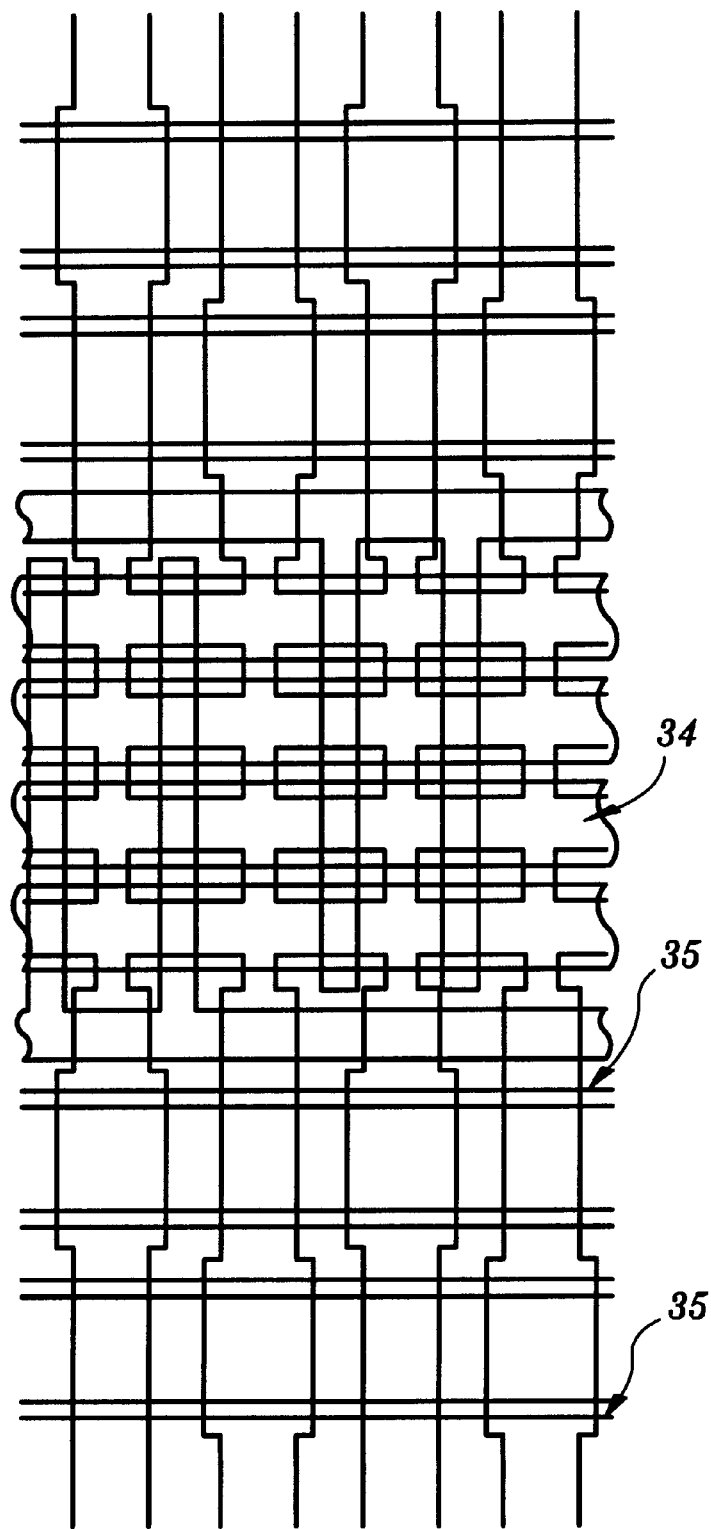
FIG. 12 is a topological view of the memory device of FIG. 6 during the process steps used in the formation of select gates and gates of block select transistors.

(D) Subsequently, as shown in FIG. 12, side walls of silicon oxide are formed on both sides of the control gate side walls in a self-aligned manner. A gate oxide layer is then disposed over the entire surface of the structure, followed by the formation of a polysilicon layer thereon.

The polysilicon layer is then subjected to a patterning process to thereby form a select gate 34 and gates of the block select transistors.

Figure 13:
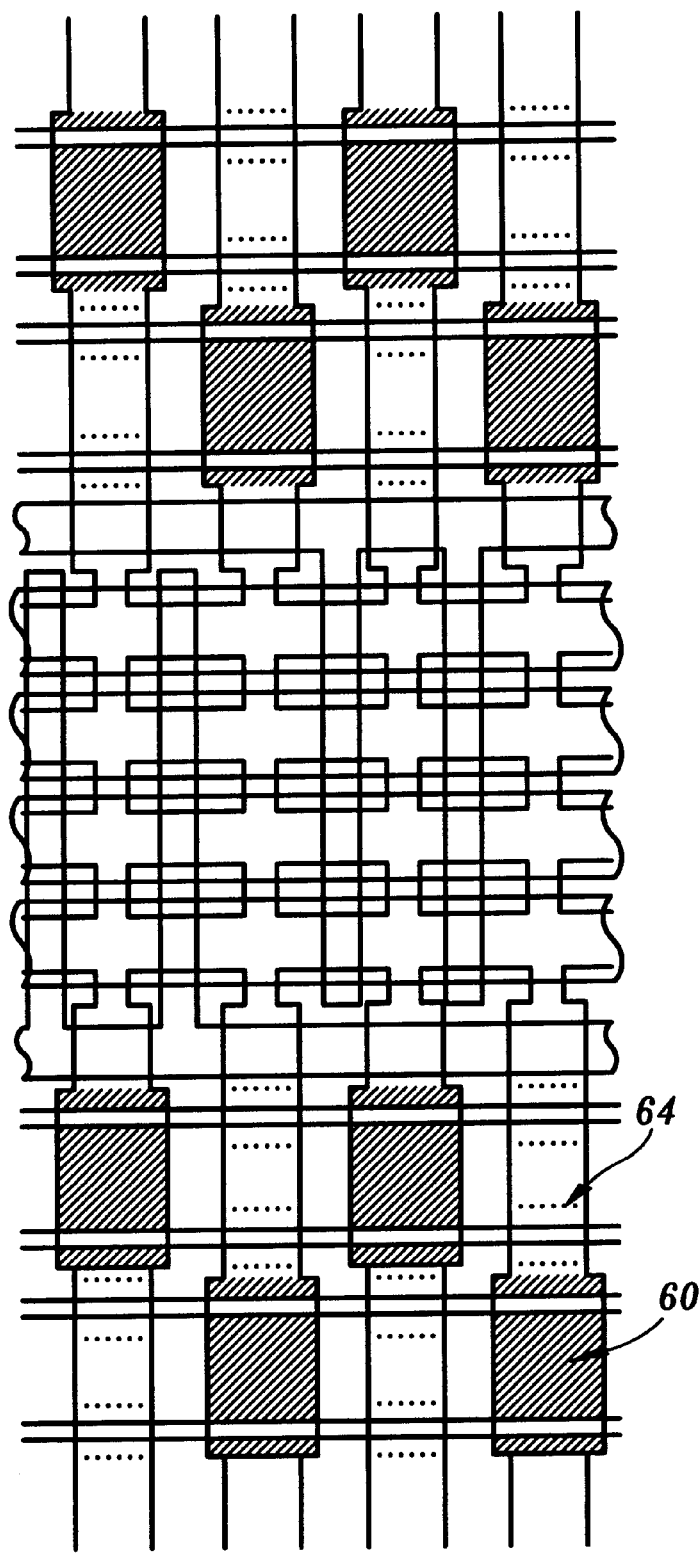
FIG. 13 is a topological view of the memory device of FIG. 6 during the process step used in the formation of source and drain regions of block select transistors.

(E) An ion implant process step with As ions is carried out into the regions 60 for the block select transistors to be formed, and source and drain regions of the block select transistors are formed, as illustrated in FIG. 13.

It is noted that the portions 64 of the strips which are overlaid by control gate strips 35 have already been implanted with As ions prior to the formation of the second gate oxide layer, as described earlier, and that an oxide layer is formed with the thickness larger than that of the gate oxide layer, which resulted from the impurity enhanced oxidation. The insulation between the memory diffusion strips and the block select transistor gates is therefore maintained.

Figure 14:
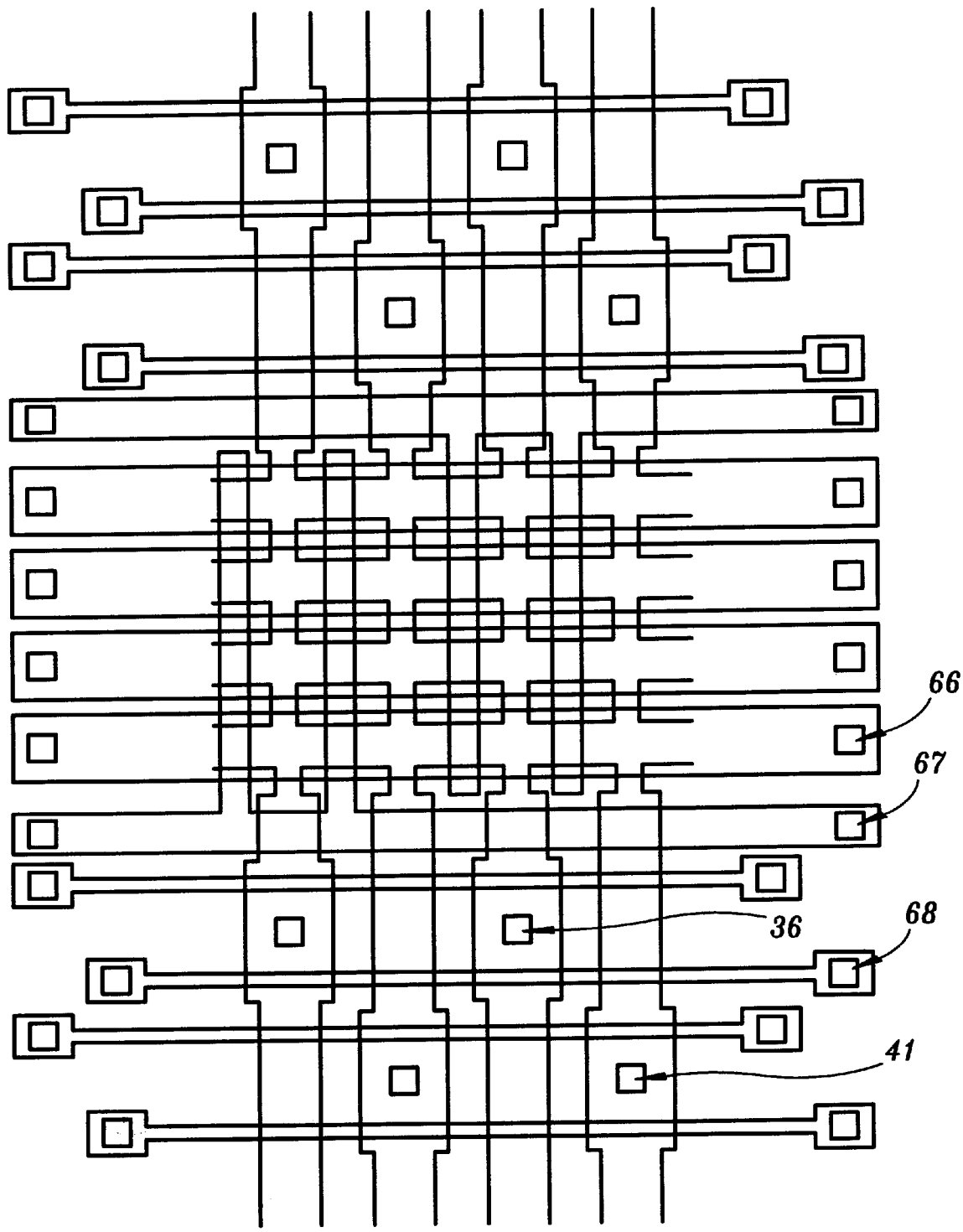
FIG. 14 is a topological view of the memory device of FIG. 6 during the process step used in the formation of contact holes.

(F) Referring to FIG. 14, a dielectric layer is disposed over the entire surface of the structure to be an interlayer dielectric layer between the polysilicon and overlying metal layers. This process step is followed by the definition of a plurality of contact holes in the regions, such as drains 36 and 41 of the block select transistor, select gates 66, control gates 67 and gates of the block select transistor 68, using the conventional photolithography technology.

The uppermost layer in the memory cell regions is generally formed more elevated from the substrate than the other regions of the memory device because of multiple layers accumulated in the cell regions.

It is noted that the block select transistors are formed between memory blocks in the present embodiment, the contact holes 36 and 41 are formed having a greater distance from the memory cells than that formed without block select transistors. This results in a decrease in the elevation of the regions for the contact holes, as described just above, and the thickness of the interlayer dielectric layer in these regions may be decreased compared to that of the peripheral circuitry.

As generally known, because of the focal depth consideration to secure the connection, the diameter of contact holes increases with the increase in the thickness of interlayer dielectrics during the photolithography process.

However, since the thickness of the interlayer dielectrics in the contact hole forming region can be decreased in the present embodiment to an extent comparable to that of the peripheral circuitry, the difficulty in contact hole diameter and the focal depth can thus be obviated, to thereby achieve contact hole diameters in the memory cell regions approximately equal to that of surrounding circuit components.

Figure 15:
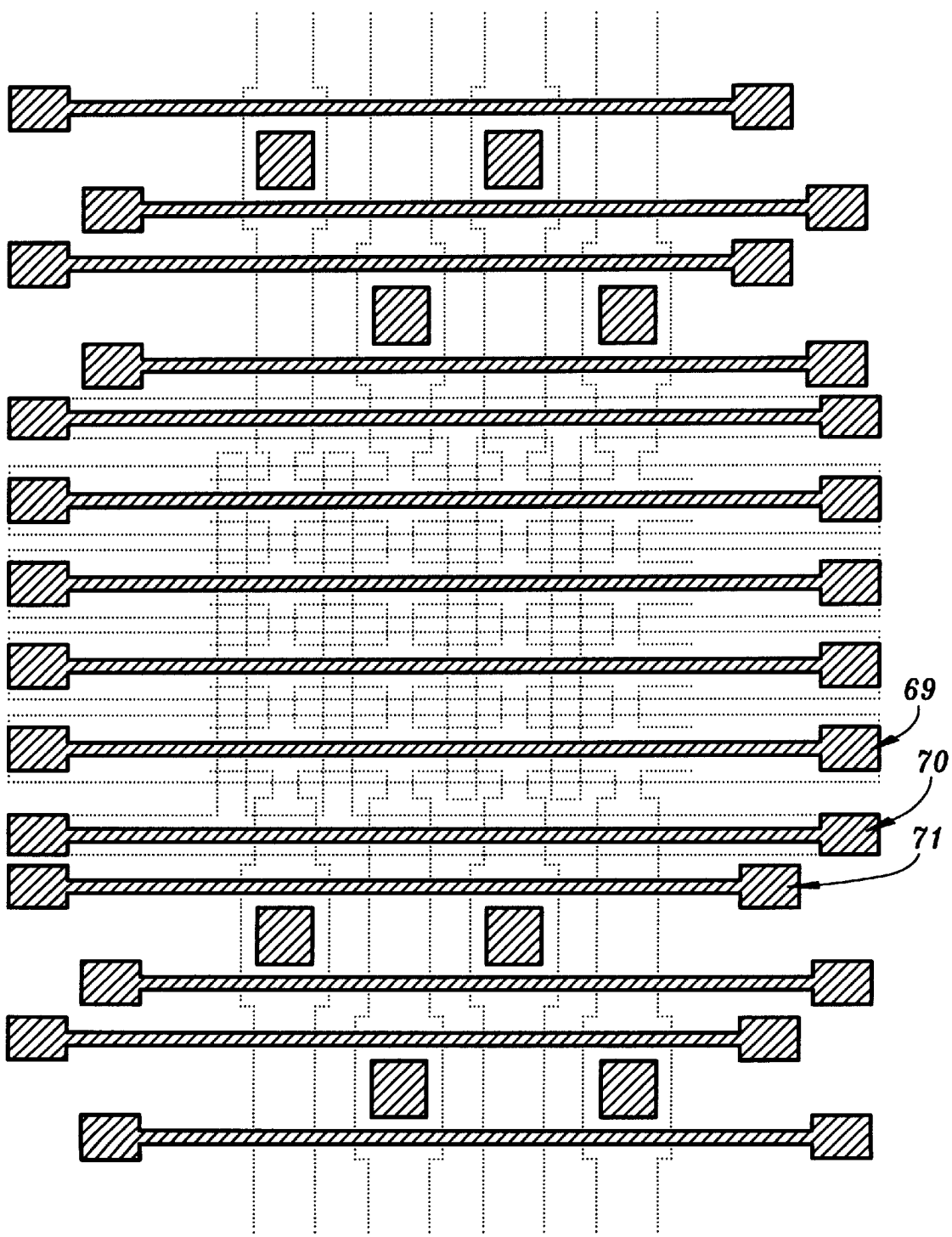
FIG. 15 is a topological view of the memory device of FIG. 6 during the process step used in the metallization.

(G) A metal layer of aluminum alloy is deposited over the entire surface of the structure, having the interlayer dielectric layer thereunder, and the desired metallization pattern is defined through conventional masking and metal etching techniques, as illustrated in FIG. 15.

During these process steps, metal strips 69 are formed in parallel with, and over the select gates having the same pitch as that of the select gates. These strips are then connected to the select gates through contact holes 66. Also during the process steps, other metal strips are formed parallel to the word line direction and connected to the control gates through contact holes 68.

Since the metal strips 69 are in the lowermost layer among metal layers in the device, the pattern of the metal strips can be defined with the same minimum dimension for the fabrication process as that for upper metal layers. The metal strips 69 can therefore be defined with the same minimum fabrication dimension as that for the memory cell, though the metal strips are perpendicular to the bit line direction or in parallel to the word line direction, as above-mentioned, which have had a minimum dimension larger than that for the bit line direction.

Figure 16:
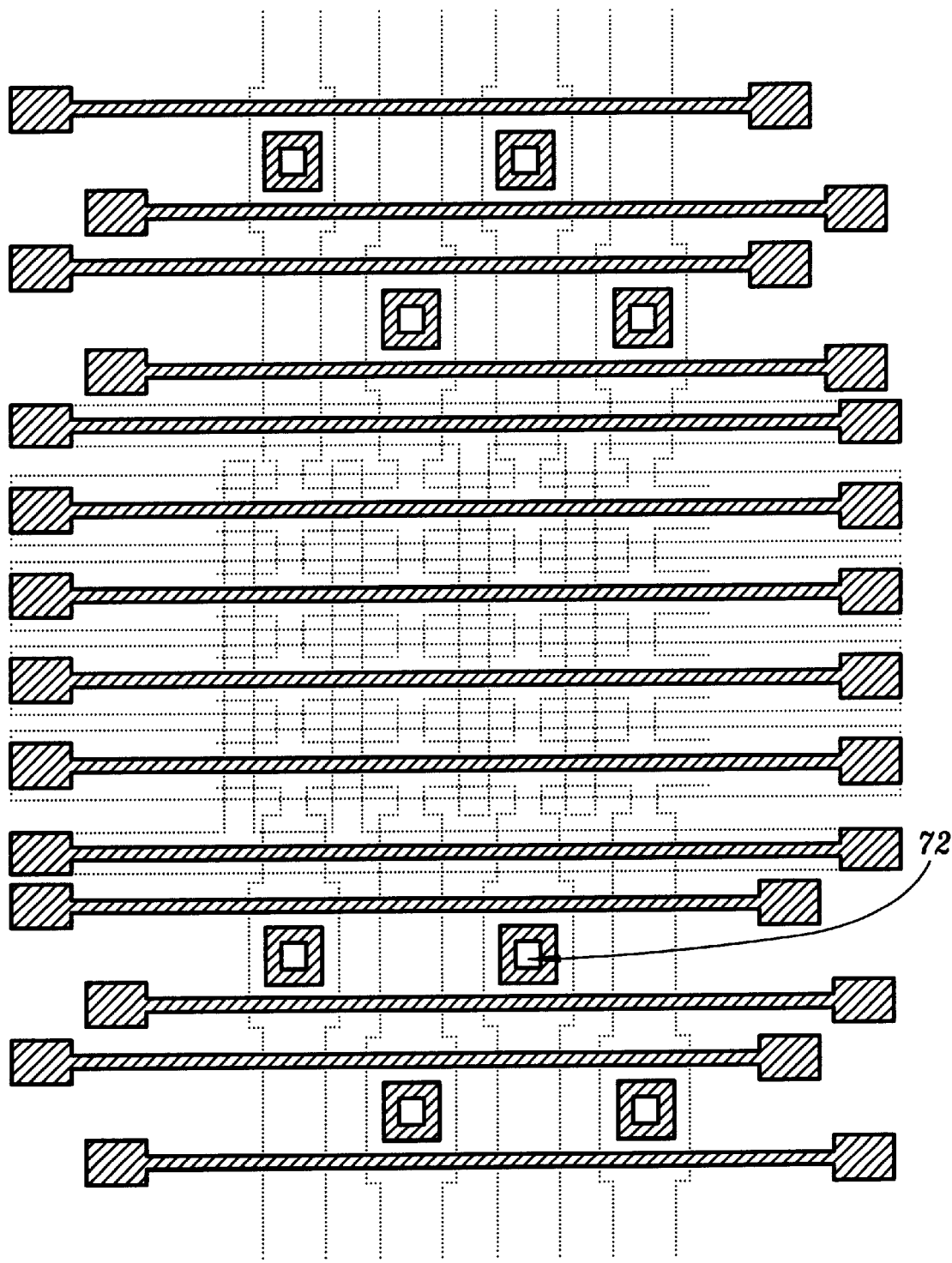
FIG. 16 is a topological view of the memory device of FIG. 6 during the process steps used in the formation of through-holes in the drain regions of the block select transistors.

(H) Referring to FIG. 16, a dielectric layer is disposed over the entire surface of the structure to be an inter-metal dielectric layer between metal layers, and through-holes 72 are then formed in the drain regions of the block select transistors 36 and 41.

As aforementioned, since the thickness of the inter-metal dielectric layer in the region for forming through-holes 72 can be fabricated to be comparable to that of the peripheral circuitry, the height of these regions from the substrate can also be made comparable to that of the contact hole forming regions. Therefore, the through-hole diameter comparable to that in the surrounding device regions can be achieved.

Figure 17:
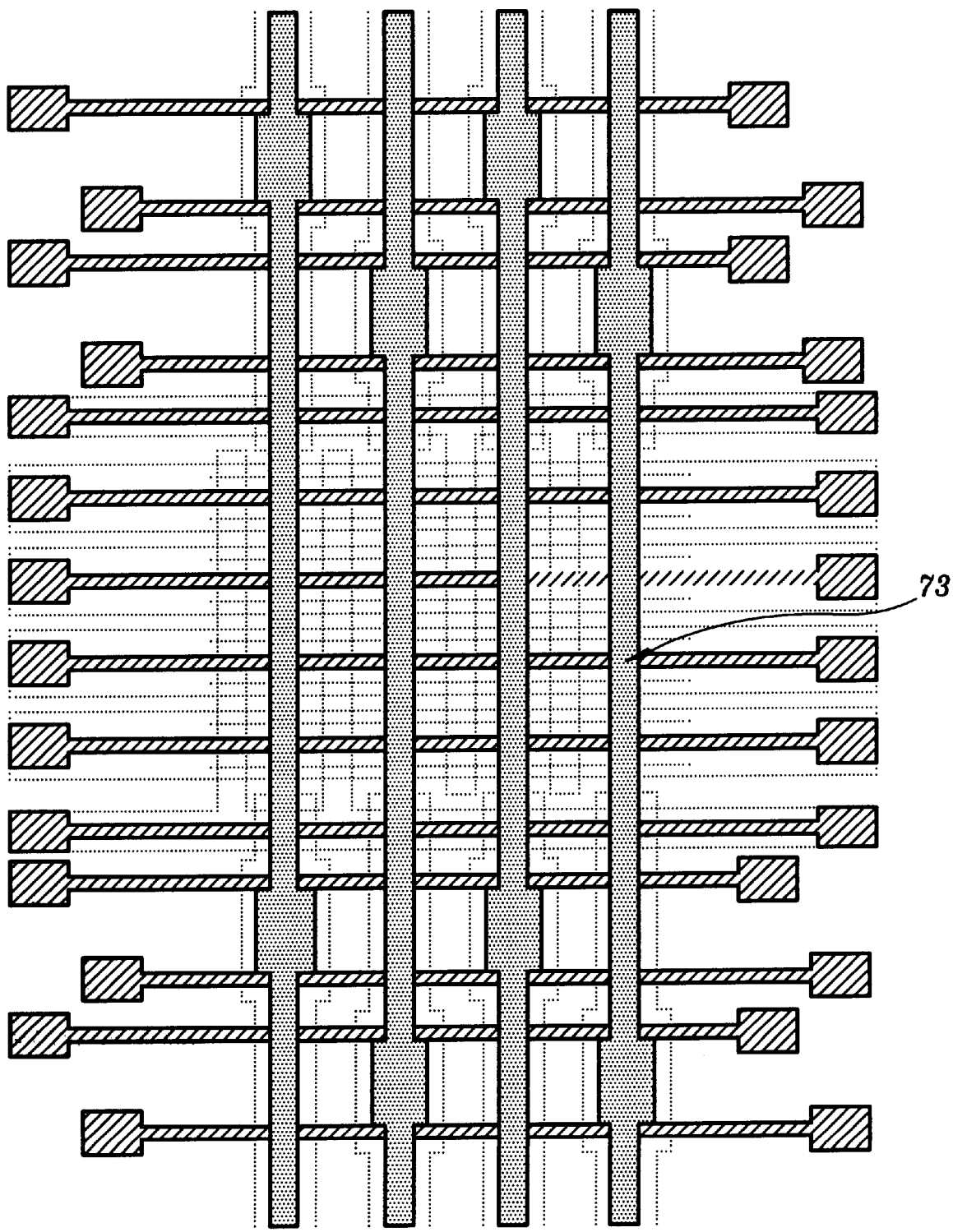
FIG. 17 is a topological view of the memory device of FIG. 6 during the process step used in the formation of metal bit lines.

(I) A metal layer of aluminum alloy is deposited over the entire surface of the structure, having an underlying inter-metal dielectric layer, and the desired metallization pattern is then defined, as illustrated in FIG. 17.

Metal strips 73 are formed in the bit line direction, having the same pitch as that of the source and drain regions, and are connected to the drains of block transistors through holes 72 and contact holes 36 and 41.

During this fabrication process, each of the metal bit lines 73 is required in general to preferably include an additional area in the through-hole forming regions to secure overlap due to the allowance consideration for the mask-alignment step during the photolithography process.

In prior art process steps of the through-hole formation in such a region the diameter of through-holes have to be made larger than that of surrounding device components, because of the focal depth consideration to secure the connection, as mentioned earlier. This has been caused by the relatively large thickness of the intermetal dielectric layer. Accordingly, in the prior art process, it has been difficult to form the upper metal layers with the same pitch as that of the lowermost metal layers, resulting in increased pitches between metal bit lines 73.

In the fabrication method of the present invention, however, it is feasible to fabricate thorough-holes even in the upper metal layers with the hole diameter comparable to that of the surrounding device components, to thereby form the metal bit lines with the same pitch as that of the memory cells. This has made it possible to obviate the above-mentioned difficulties encountered in the prior process steps.

This application is based on Japanese Patent Application No. 9-141,069 filed May 14, 1997, the entire contents of which are herein incorporated by reference.

Additional modifications and variations of the present invention are possible in light of the above teachings. It is therefore to be understood that within the scope of the appended claims, the invention may be practiced otherwise than as specifically described herein.

What is claimed is:

1. An electrically programmable non-volatile memory device including a plurality of memory cells arranged in a matrix, comprising:

a substrate of silicon of a first conductivity type;

a plurality of memory diffusion strips of a second conductivity type formed in said substrate parallel to each other such that a pair of said memory diffusion strips are arranged alternatively to be source and drain regions of a plurality of memory cells;

a gate dielectric layer formed on the entire surface of the substrate;

a first conductor strip formed to be floating gates of said memory cells, over said gate dielectric layer and between said source and drain regions, having a length smaller than that of from said source to drain and at a distance closer to said drain region than to said source region;

a second conductor strip formed to be control gates of said memory cells, over said first conductor strip and over an underlying dielectric layer, in parallel to said source and drain regions and connected together with said plurality of memory cells;

a third conductor strip formed to be select gates of said memory cells, in perpendicular to, and over said second conductor strip and over an underlying dielectric layer, connected to a plurality of said memory cells arranged in matrices;

and said plurality of memory cells in matrices capable of being selected as each memory block by a plurality of metal bit lines, wherein each of said memory blocks may consist of a plurality of memory cells defined independently of the regions of said memory cells that share the same metal bit line, said memory diffusion strips within said memory block are formed with source and drain regions of said memory cells, being divided from other memory blocks, such that each said memory diffusion strip is connected to one of said metal bit lines through one of block transistors;

and wherein said control gates are formed connecting a plurality of said memory cells within said memory block, being divided from other memory blocks.

2. An electrically programmable non-volatile memory device comprising:

a substrate of silicon of a first conductivity type;

a plurality of memory diffusion strips of a second conductivity type formed in said substrate parallel to each other such that a pair of said memory diffusion layers are arranged alternatively to be source and drain regions of a plurality of memory cells;

a gate dielectric layer formed on the entire surface of said substrate;

a first conductor strip formed to be floating gates of said memory cells, over said gate dielectric layer and between said source and drain regions, having a length smaller than that of from said source to drain and at a distance closer to said drain region than to said source region;

a second conductor strip formed to be control gates of said memory cells, over said first conductor strip and over an underlying dielectric layer, in parallel to said source and drain regions and connected together with said plurality of memory cells;

a third conductor strip formed to be select gates of said memory cells, in perpendicular to, and over said second conductor strip and over an underlying dielectric layer, connected to a plurality of said memory cells arranged in matrices;

and said plurality of memory cells in matrices capable of being selected as each memory block by a plurality of metal bit lines, wherein each of said memory blocks may consist of a plurality of memory cells defined independently of the regions of said memory cells that share the same metal bit line;

said memory diffusion layers within said memory block are formed with source and drain regions of said memory cells, being divided from other memory blocks, such that each of said memory diffusion layers is connected to one of said metal bit lines through one of block transistors that is formed in the region between two of said memory blocks in the bit line direction, and wherein said control gates are formed to connect a plurality of said memory cells such that each said memory block may be operable independently of other memory blocks, a pair of said control gates that share the same drain region are connected together to be equipotential and to form a control gate pair, said control gate pairs are connected together within said memory block such that one group of connected control gate pairs is connected not to such a group of connected pairs adjacent to said group of connected pairs but to the group of connected pairs next adjacent thereto, and all of said pairs of control gates of said memory cells in said memory block are connected in a similar manner within said memory block to thereby form two sets of said control gates connected together within said memory block.

3. The electrically programmable non-volatile memory device according to claim 1, wherein the impurity concentration in said source and drain regions of said block transistor is the same as that in transistors of peripheral circuitry.

4. The electrically programmable non-volatile memory device according to claim 2, wherein the impurity concentration in said source and drain regions of said block transistor is the same as that in transistors of peripheral circuitry.

5. The electrically programmable non-volatile memory device according to claim 1, wherein two groups of gate electrodes of block select transistors formed in line, one connected to source regions and the other connected to drain regions of said memory cells, respectively, are each formed spaced-apart, parallel to each other and to the word line direction.

6. The electrically programmable non-volatile memory device according to claim 2, wherein two groups of gate electrodes of block select transistors formed in line, one connected to source regions and the other connected to drain regions of said memory cells, respectively, are each formed spaced-apart, parallel to each other and to the word line direction.

7. The electrically programmable non-volatile memory device according to claim 1, wherein a plurality of said metal bit lines in strips are provided spaced apart, being essentially parallel to, and with a distance approximately equal to that of said memory diffusion layers, having overlying dielectric layers, and connected to said block select transistors through contact holes that are formed on extensions of said memory diffusion layers;

a plurality of metal word lines in strips are provided spaced apart, being essentially parallel to said select gates, and having a distance approximately equal to that of said select gates, having dielectric layers, and connected to said select gates through contact holes that are formed on extensions of said select gates, and wherein said metal word lines are provided under said metal bit lines.

8. The electrically programmable non-volatile memory device according to claim 2, wherein a plurality of said metal bit lines in strips are provided spaced apart, being essentially parallel to, and with a distance approximately equal to that of said memory diffusion layers, having overlying dielectric layers, and connected to said block select transistors through contact holes that are formed on extensions of said memory diffusion layers;

a plurality of metal word lines in strips are provided spaced apart, being essentially parallel to said select gates, and having a distance approximately equal to that of said select gates with overlying dielectric layers, and connected to said select gates through contact holes that are provided on extensions of said select gates, and wherein said metal word lines are provided under said metal bit lines.

9. The electrically programmable non-volatile memory device according to claim 1, wherein at least two contact holes are formed on said control gates, and wherein, a plurality of metal layers in strips are formed spaced apart, being essentially parallel to said word lines, having overlying dielectric layers, and connected to said control gates through said contact holes.

10. The electrically programmable non-volatile memory device according to claim 2, wherein at least two contact holes are formed on said control gates, and wherein, a plurality of metal layers in strips are formed spaced apart, being essentially parallel to said word lines, having overlying dielectric layers, and connected to said control gates through said contact holes.

11. The electrically programmable non-volatile memory device according to claim 1, wherein at least two contact holes are formed on gate electrodes of said block select transistors, and wherein a plurality of metal layers in strips are formed spaced apart, being essentially parallel to said word lines, having overlying dielectric layers, and connected to said gate electrodes through said contact holes.

12. The electrically programmable non-volatile memory device according to claim 2, wherein at least two contact holes are formed on gate electrodes of said block select transistors, and wherein a plurality of metal layers in strips are formed spaced apart, being, essentially parallel to said word lines, having overlying dielectric layers, and connected to said gate electrodes through said contact holes.

* * * * *